United States Patent
Stewart (10) Patent No.: US 7,319,424 B2
(45) Date of Patent: Jan. 15, 2008

(54) MEASURING AND CORRECTING NON-LINEARITY OF AN INTERNAL MULTI-BIT ANALOG-TO-DIGITAL CONVERTER IN A DELTA-SIGMA ANALOG-TO-DIGITAL CONVERTER

(75) Inventor: Brian Stewart, Cary, NC (US)

(73) Assignee: Agilent Technologies, Inc., Santa Clara, CA (US)

( * ) Notice: Subject to any disclaimer, the term of this patent is extended or adjusted under 35 U.S.C. 154(b) by 157 days.

(21) Appl. No.: 11/344,611

(22) Filed: Jan. 31, 2006

(65) Prior Publication Data

US 2007/0176805 A1  Aug. 2, 2007

(51) Int. Cl.
*H03M 1/56* (2006.01)

(52) U.S. Cl. ..................... 341/169; 341/155

(58) Field of Classification Search ......... 341/120–170
See application file for complete search history.

(56) References Cited

U.S. PATENT DOCUMENTS 5,068,657 A * 11/1991 Tsai ........................ 341/120
6,992,606 B2 * 1/2006 Zogakis et al. ............. 341/143

* cited by examiner

*Primary Examiner*—Lam T. Mai
(74) *Attorney, Agent, or Firm*—Judy Liao Shie (57) ABSTRACT

An internal ADC in a delta-sigma ADC is characterized using inherent delta-sigma ADC circuitry. In one embodiment, a constant DC value is applied as the input signal. The sum of the constant DC value and a feedback signal is integrated. Then, a digital approximation including the integrated sum is generated. The feedback signal is generated and allows ramping of the integrated sum.

18 Claims, 5 Drawing Sheets

MEASURING AND CORRECTING NON-LINEARITY OF AN INTERNAL MULTI-BIT ANALOG-TO-DIGITAL CONVERTER IN A DELTA-SIGMA ANALOG-TO-DIGITAL CONVERTER

BACKGROUND OF THE INVENTION

Measurement instruments commonly sample an analog input signal and convert it into a digital representation. Many of these instruments rely on delta-sigma analog-to-digital converters (ADCs) to perform the conversions. The delta-sigma ADCs may, in turn, include internal ADCs as components. If an internal ADC does not function in a linear manner, however, the accuracy of the total analog-to-digital conversion will suffer. Therefore, what is needed is a method and apparatus for detecting and correcting non-linearity of an internal ADC within a delta-sigma ADC.

SUMMARY OF THE INVENTION

In one embodiment of the present invention, a method is described for testing the linearity of an internal ADC in a delta-sigma ADC without requiring the use of any additional test circuitry. Instead, the linearity is tested using inherent delta-sigma ADC circuitry.

In an alternate embodiment of the present invention, a circuit is disclosed for correcting any non-linearity found in the internal ADC. The average non-linearity in the internal ADC is measured, and then used to generate corrected values. The corrected values are stored in a lookup table in the circuit. During normal operation, each internal ADC output value is substituted with the proper corrected value from the lookup table.

Further features and advantages of the present invention, as well as the structure and operation of preferred embodiments of the present invention, are described in detail below with reference to the accompanying exemplary drawings.

DETAILED DESCRIPTION

Figure 1:
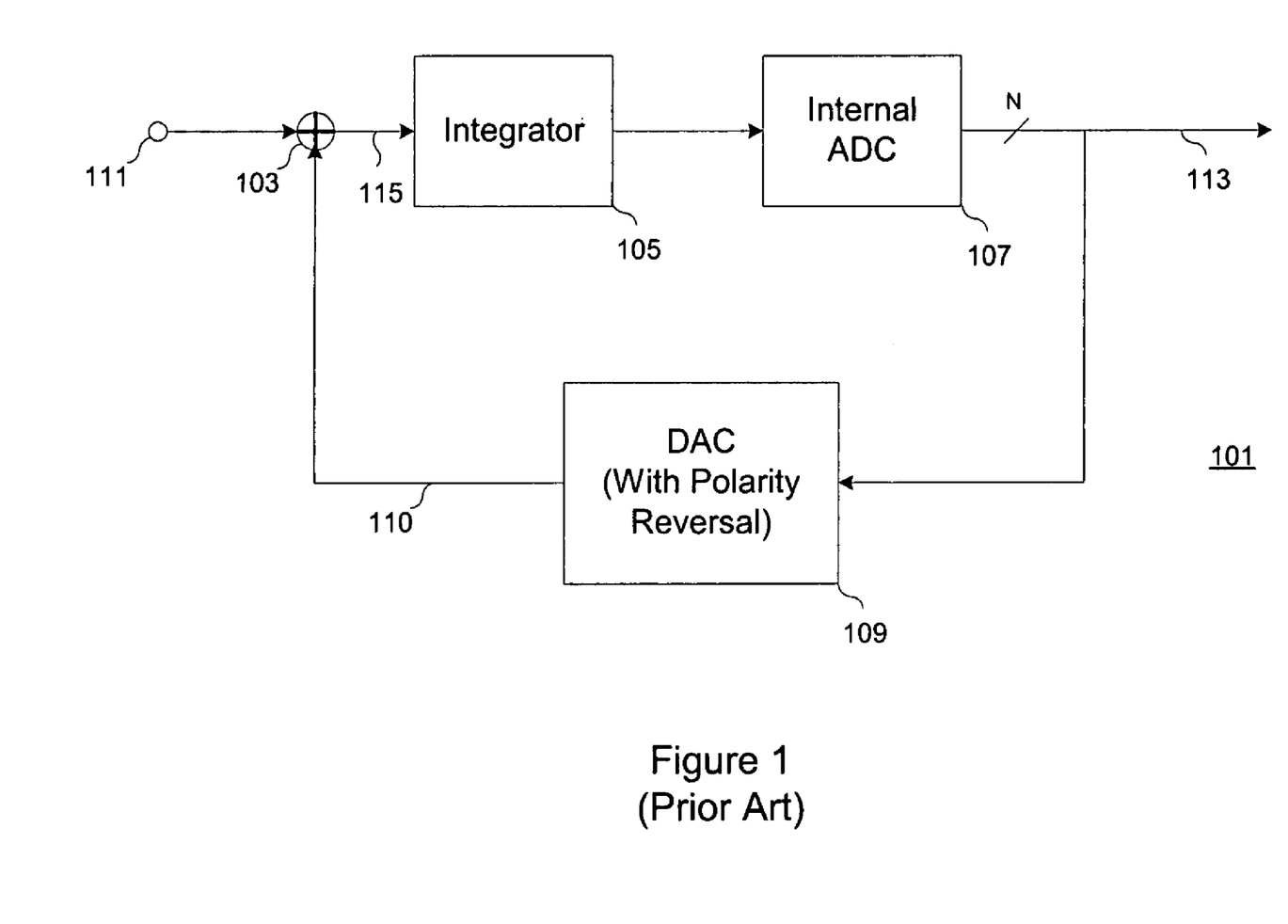
FIG. 1 shows a prior art delta-sigma ADC.

FIG. 1 shows a simplified block diagram of a prior art delta-sigma analog-to-digital converter (ADC) 101. It includes a summer 103, an integrator 105, an internal N-bit ADC 107 where N>0, and a digital to analog converter (DAC) 109 in the feedback path. Please note that, in describing FIG. 1 and the other circuits throughout the rest of this discussion, the term "ADC" is used in identifying two different things: (1) the high-level system (e.g. 101), referred to as the "delta-sigma ADC" or "system ADC"; and (2) the lower-level component (e.g. 107) within the high-level system, referred to as the "internal ADC".

The basic architecture of the delta-sigma ADC 101 is well-known in the art, but a brief description of its behavior is useful in understanding the present invention. An analog signal is applied to the input 111 of the delta-sigma ADC 101, and an N-bit digital representation of the input signal is produced at the output 113 at a fixed decision rate. The digital value at output 113 is converted to an analog feedback value (110) with a polarity reversal by the DAC 109 and then fed back to the summer 103. The summer 103 produces an error signal 115 that is the sum of the feedback value 110 and the input 111.

Since the internal ADC 107 can only produce quantized values at the output 113, the output value 113 (and thus the feedback value 110) will almost never exactly match the input signal 111. The error signal 115 indicates how far off the quantized output signal 113 is from the input signal 111.

The error signal 115 is applied to the integrator 105, which "accumulates" the error signal 115 for each cycle. The output of the integrator 105 increases or decreases in response to the error signal 115 until it causes the internal ADC 107 to switch its output to another quantized level. This output value 113 is fed back through the DAC 109 and the process repeats itself.

As mentioned earlier, the quantized nature of the internal ADC 107 means that the instantaneous output 113 probably will not match the input value. However, by oversampling the input signal 111 and averaging the output 113 over a period of time, a very precise representation of the input signal 111 can be obtained. Typically, a digital filter (not shown) performs this averaging function. Further digital processing in addition to the averaging (such as decimation) is typically also performed. For more detailed information on the delta-sigma architecture and its use in various applications, please see DELTA-SIGMA DATA CONVERTERS Theory, Design, and Simulation, edited by Steven R. Norsworthy, Richard Schreier, and Gabor C. Temes, published in 1997 by the IEEE Press (ISBM 0-7803-1045-4).

The architecture of delta-sigma ADC 101 has two significant issues. First, the internal ADC 107 must be both low latency and high resolution to produce a fast, low noise system ADC. Such an internal ADC is typically expensive. Second, the linearity of the ADC is determined by the linearity of the DAC 109. For N>1, the DAC linearity is frequently unacceptable. A number of improved architectures mitigate these issues.

Figure 2:
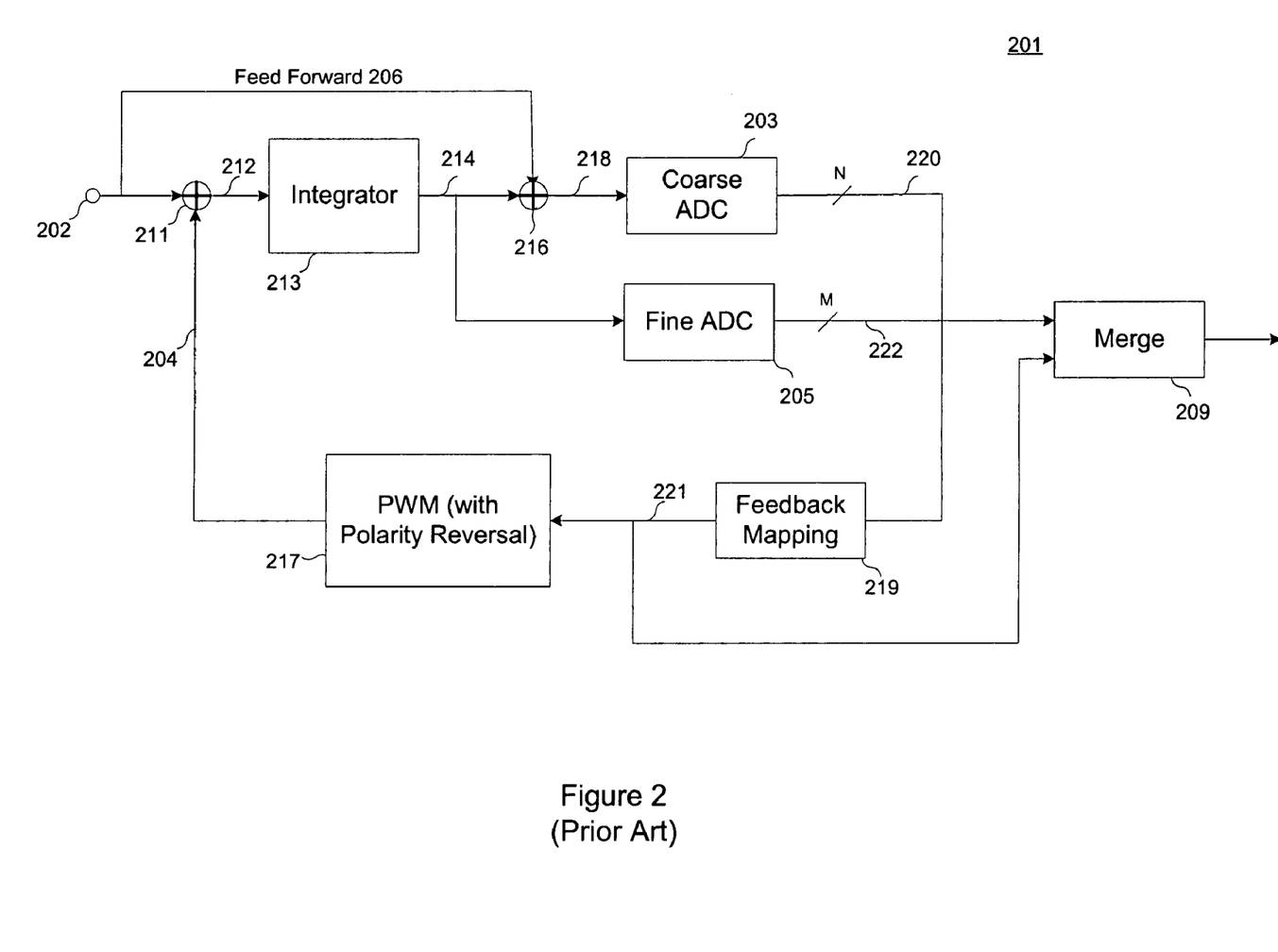
FIG. 2 shows a prior art cascaded delta-sigma ADC.

Refer now to FIG. 2. FIG. 2 shows a prior art, cascaded delta-sigma ADC 201 that improves upon the circuit of FIG. 1. Cascaded delta-sigma ADC 201 uses two internal ADCs for improved resolution: a coarse ADC 203 having N output bits, and a fine ADC 205 having M output bits, where N>0 and M>1. Typically, the coarse ADC 203 and the fine ADC 205 are separate chips or devices. Delta-sigma ADC 201 also uses a pulse width modulator (PWM) 217 in place of the DAC 109 for improved linearity. Only a brief description of the delta-sigma ADC 201 will be given here, since a similar circuit is described in detail in U.S. patent application Ser. No. 11/221,620, "Precision Low Noise Delta-Sigma ADC With AC Feed Forward And Merged Coarse And Fine Results", assigned to Agilent Technologies, Inc.

An analog signal is applied to input 202. A first voltage summer 211 receives the input 202, adds it to an analog feedback 204, and applies its own output 212 to an integrator 213. A second voltage summer 216 receives the integrator output 214, combines it with a feed forward 206 of the input signal 202 and applies its own output (218) to the coarse ADC 203. The feed forward 206 is optional. The coarse ADC output 220 is a digital representation of the analog input signal 202. Due to quantization errors, output 220 is almost never an exact digital representation of the analog input signal.

The feedback mapping 219 converts each coarse ADC output code to a feedback value 221. During normal operation, this feedback mapping 219 implements a simple gain. The PWM 217 receives the feedback value 221, reverses its polarity, and produces the analog feedback 204 in the form of a pulse having a precise amplitude and duty cycle. Although it may seem odd at first glance to convert a digital value into a pulse rather than a steady analog DC voltage (as conventional DACs might do), PWM 217 effectively performs the same function as a conventional DAC. Since the integrator 213 averages its input over time, the average value over time for a constant duty cycle pulse of constant amplitude corresponds exactly to a unique and steady analog DC voltage. However, this combination of the PWM 217 and integrator 213 has greater linearity than a conventional DAC.

There are many different ways to implement the PWM 217. In one embodiment, the PWM 217 generates just two analog output levels. For each decision cycle, the PWM 217 switches between those two output levels at times determined by the desired average output level for the current decision cycle. The analog feedback 204 is then created by toggling between the two output levels at the appropriate points in the decision cycle to create the target average feedback value.

A fine ADC 205 receives the integrator output 214. The integrator output 214, otherwise known as the error signal 214, includes the portion of the input signal 202 that the coarse ADC 203 did not have sufficient resolution to represent due to quantization. The error signal 214 is converted by the fine ADC 205, associated with the correct instance of the feedback value 221, and recombined by a merge mechanism 209 to represent the input signal in digital form. The merge mechanism 209 sums the feedback value 221 after a unit delay with the fine ADC output 222 after differentiation and scaling. As with the delta-sigma ADC 101 of FIG. 1, the output of the merge mechanism 209 typically passes through a digital filter (not shown) and further digital processing prior to reaching its final output form.

The fine ADC 205 only needs to convert the error signal 214, which includes the portion of the input signal that the coarse ADC 203 did not have sufficient resolution to represent, rather than the entire input signal 202. Since the error signal 214 is smaller in magnitude than the input signal 202, the input range of the fine ADC 205 is smaller than the input range of the coarse ADC 203. So, even if the fine ADC 205 and the coarse ADC 203 have the same number of output bits, the fine ADC 205 achieves finer resolution than the coarse ADC 203 relative to input signal 202. In this manner, two lower-resolution internal ADCs can economically achieve an output resolution comparable to that of a single, more expensive, and higher-resolution internal ADC. Delta-sigma ADC 201 is only one type of a cascaded delta-sigma ADC. Even better resolution can be achieved by adding a third internal ADC to resolve the error from the fine ADC 205, and a fourth internal ADC to resolve the error from the third internal ADC, etc., cascading more internal ADCs until the desired resolution is achieved.

Non-linearity in the internal ADC 107 of delta-sigma ADC 101 and the internal ADC 205 in delta-sigma ADC 201 produces errors in the conversion from analog to digital values. The best way to measure the linearity of a typical ADC is to plug in a sweep of values at the input, and then check the output. Ideally, there should be a linear relationship between the input and output. However, in the delta-sigma ADCs 101 and 201 of FIGS. 1 and 2, there is not an easy way to directly access the input of the internal ADCs (107, 203, and 205) for testing purposes, without building separate test circuitry into the system. It would be desirable to measure the linearity of the internal ADCs without having to build separate test circuitry. Further, it would be advantageous to detect and correct any non-linearity. In one embodiment of the present invention, a method for measuring the non-linearity of an internal ADC is disclosed. In another embodiment of the present invention, a correction for non-linearity in an internal ADC is disclosed.

Figure 3:
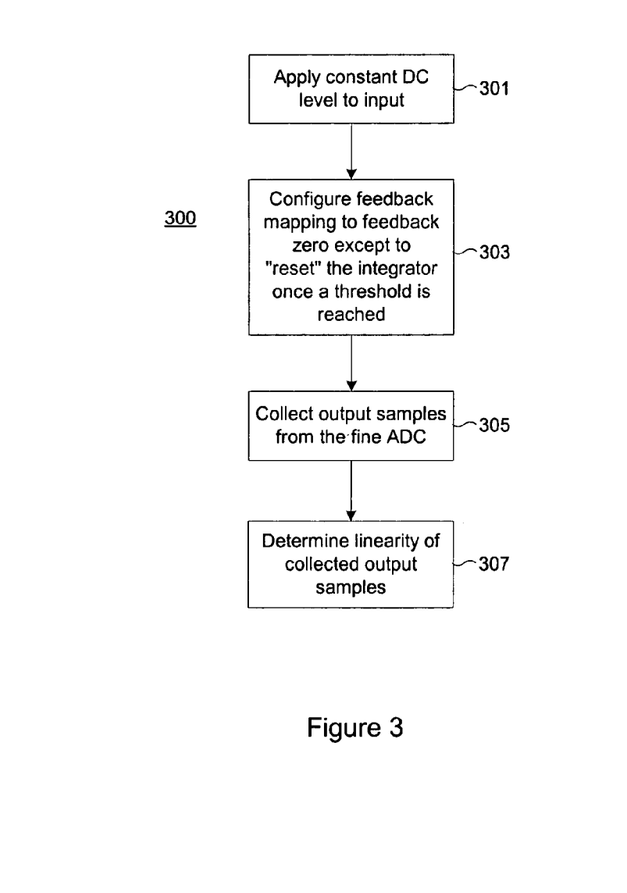
FIG. 3 shows a flow chart describing a method for determining the non-linearity of an internal ADC in a delta-sigma ADC.

FIG. 3 is a flowchart that depicts an embodiment of the present invention. It describes a method 300 for testing the linearity of internal ADCs (107, 203, and 205) of FIGS. 1 and 2 by taking advantage of the inherent ramping ability of the integrator in a delta-sigma ADC. No additional test circuitry is needed. For the sake of simplicity, the present discussion will focus on testing just the fine ADC 205 as an illustrative example. But the method 300 is easily modified to test the coarse ADC 203 of FIG. 2, the internal ADC 107 of FIG. 1, as well as any internal ADC within a cascaded delta-sigma ADC architecture.

FIGS. 4A–4E show graphs of the circuit response at different points in the delta-sigma ADC 201 under test with method 300. The outputs are plotted at discrete time points N sampled at the decision rate. The graphs in FIGS. 4A–E are not to scale, but are included as a visual guide to help the reader gain a better understanding of how the method and circuit function.

Figure 4A:
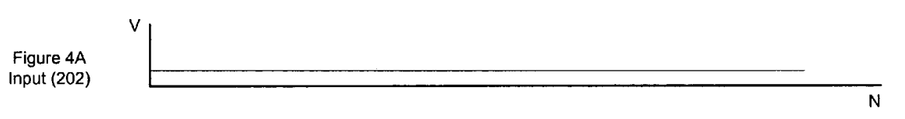
FIGS. 4A–E show graphs of different points in the delta-sigma ADC of FIG. 2, while being tested with the method of FIG. 3.

First, in step 301, the input 202 to the delta-sigma ADC 201 is held at a constant DC level. For example, this may be done by applying an internal short or an external DC source to the input 202 (see FIG. 4A). For the sake of simplicity, the discussion of method 300 assumes that the DC input value is positive, as shown in FIG. 4A. However, it will be obvious to one of ordinary skill in the art that, with a few easy adjustments, this method is equally applicable to DC input values that are negative or zero.

Figure 4B:
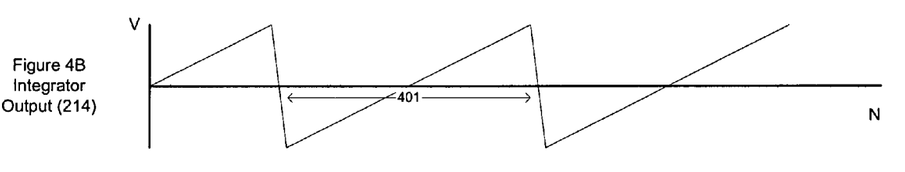
Figure 4C:
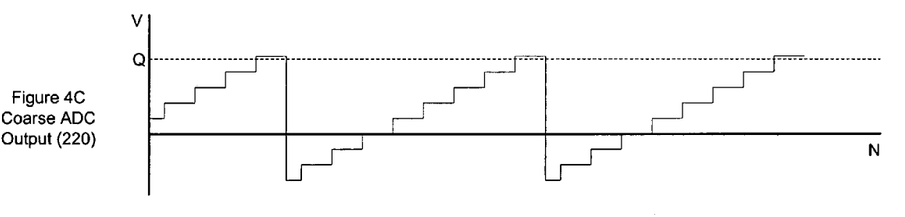
Figure 4D:
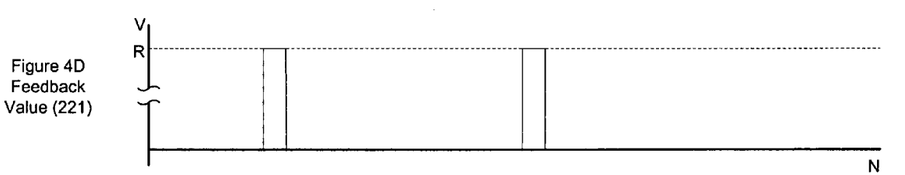
Figure 4E:
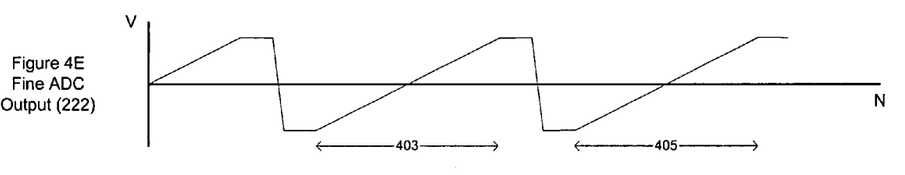

The integrator 213 integrates the DC input value and generates a corresponding increasing ramp having a constant slope when sampled at the decision rate (see FIG. 4B, e.g. time interval 401). Between samples, the integrator output 214 may slew up and down due to the operation of PWM 217. The DC input value is selected to optimize the output slope of the integrator 213. A larger DC value will cause the integrator output 214 to increase at a faster rate, whereas a smaller DC value will cause the integrator output 214 to increase at a slower rate. Alternatively, if an external DC source is not available, the input 202 can also just be zeroed or grounded. The nature of analog circuits is such that although the input 202 is grounded, the integrator 213 will effectively "see" a slight voltage due to input and integrator offset, which is sufficient to cause the integrator output 214 to ramp. When using an external DC source, the value selection should account for the input and integrator offset.

In step 303, the feedback mapping 219 is configured to produce a fixed value, except to "reset" the integrator output 214 to the low end of the fine ADC 205 range (or beyond) once the integrator output 214 exceeds a threshold level. The fixed value causes the integrator to ramp linearly. The "reset" allows the integrator output 214 to begin ramping anew before reaching saturation. All output values of the coarse ADC 203 less than the threshold level Q causes the PWM 217 to generate a fixed value. The fixed value is typically zero but could be adjusted to account for a large integrator offset if an external DC input is not available. This fixed value allows the integrator output 214 to continue ramping. If an external DC input is not available and the best available fixed value produces a ramp that is too fast, a fixed pattern of values may be used that produces a slower average drift. If this method is used, the ramp processing must adjust for the pattern of feedback values or independently process ramps corresponding to each step in the pattern. Any coarse ADC 203 output values above the threshold level Q cause the feedback mapping 219 to feed back a large value R (see FIGS. 4C and 4D). The large value R becomes a large negative value R pulse after the polarity reversal of the PWM 217, and resets the integrator output 213 by decreasing it by a large amount.

The threshold level Q and the value R are chosen so that the entire input range of the fine ADC 205 will be tested. The threshold level Q should be high enough to exceed the input range of the fine ADC 205, and the negative value R should be low enough to drop the integrator output 214 below the input range of the fine ADC 205 in one decision cycle. However, depending on the relative ranges of the coarse and fine ADCs, it may be necessary to adjust R by an amount proportional to the degree to which the coarse ADC value exceeds the threshold level Q, or to feed back R for more than one cycle once the threshold level Q is exceeded, regardless of the coarse ADC output.

In one embodiment, implementing the reset and ramping behavior of the integrator output 214 only requires changing the feedback mapping 219. Typically, the feedback mapping 219 is implemented with a lookup table that maps each coarse ADC output code to a desired feedback value 221. The threshold level Q is implemented by changing the entries in the lookup table so that all coarse ADC output codes greater than Q map to R. The remaining entries in the lookup table map to a fixed value (usually zero). There are many different ways to implement the feedback mapping 219 and PWM 217, and therefore many other ways to implement the threshold behavior.

This feedback scheme serves two purposes. First, the feedback is constant during the integrator ramping phase (interval 401 on FIG. 4B) which keeps the ramp linear. Second, the integrator 213 does not saturate, which allows the automatic generation of multiple ramps and avoids analog problems associated with saturation. This method may be adapted to both positive and negative integrator drift.

In an alternate embodiment, this same effect of repetitive integrator ramping may be achieved by keeping the feedback value 221 set at zero. Instead, the input DC voltage maintains a positive DC value except when pulsed negative to "reset" the integrator output 214. This method is an inferior approach, in part because of the difficulty in determining how often and how long the input should be switched negative to periodically drop the integrator output 214 to the desired value. Some trial and error is needed to match the input to the desired integrator behavior. Further, switching the input requires an external source that is capable of generating pulses. Despite these drawbacks, this is still a feasible method. Another way to effect the repetitive integrator ramping is to periodically generate negative pulses via the feedback. This does not need an external source that produces pulses but does require the determination of acceptable periods and duration for the negative feedback pulses.

Continuing to step 305, a long sequence of output samples from the fine ADC 205 are collected and saved. The collected data typically spans many complete ramp cycles. Since the output range of the integrator 213 usually exceeds that of the fine ADC 205, the fine ADC output 222 will likely saturate at the highest and lowest values of the integrator output 214. (See FIG. 4E). If so, the output samples from the fine ADC 205 will follow a pattern of negative saturation, then an increasing ramp (403, 405), then positive saturation, and then a step or short ramp back to negative saturation. This pattern will repeat so long as the input to the system, the threshold Q, and the large negative value R, are held constant. The fine ADC output values collected during the increasing ramps (403, 405) are the values of interest in determining linearity.

Finally, in step 307, the collected output data samples are processed to determine the fine ADC integral non-linearity. This processing can be done using mathematical computation software such as MATLAB, and is described in more detail below.

The method 300 can be easily modified to test the internal ADC 107 of FIG. 1. First, the threshold level Q should be increased to the high end of the internal ADC 107 input range. Then, the negative value R is lowered so that, when the integrator output ramps downward, the integrator output will fall to the low end of the internal ADC 107 input range before beginning to ramp up again. This modified method is applicable to the coarse ADC 203 of FIG. 2, as well.

Figure 5:
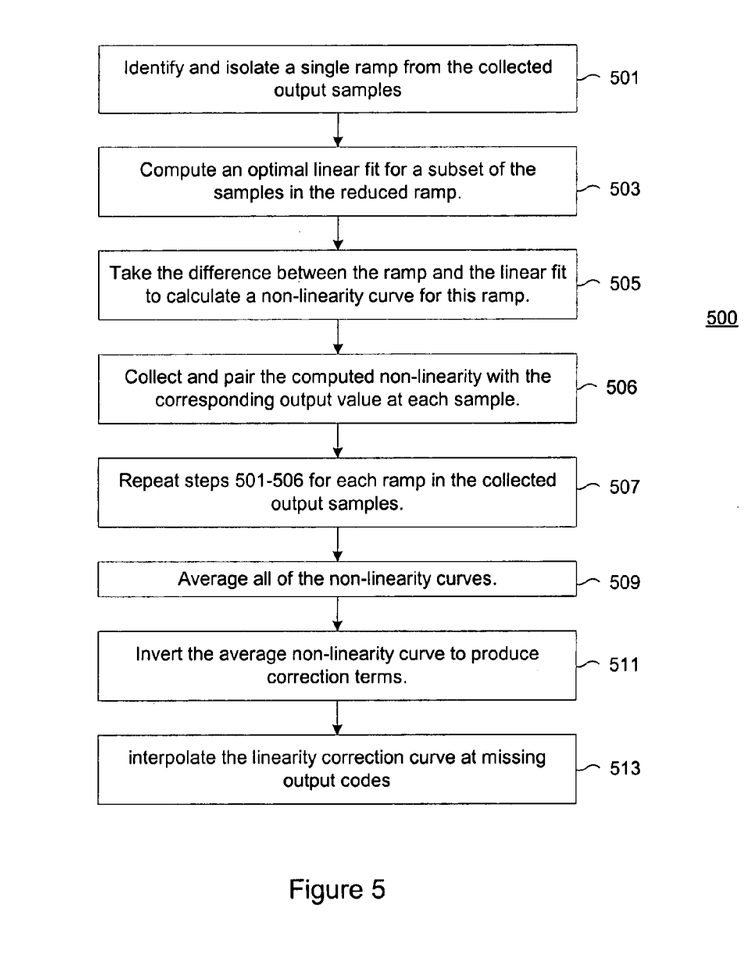
FIG. 5 shows a flow chart describing a method for determining the integral non-linearity of an internal ADC and correcting that non-linearity.

Refer now to FIG. 5, which is a flow chart of a method 500 for determining the linearity of the collected fine ADC output data samples, and for correcting any detected non-linearity. It should be noted that this method 500 is just one of many that can be used to determine the integral non-linearity of an internal ADC. First, in step 501, each complete ramp cycle is isolated by detecting a pattern of negative saturation, ramping, and positive saturation in the fine ADC output 205. If saturation of the fine ADC output 205 does not occur, high and low isolation thresholds may be used instead to isolate each ramp. Each isolated ramp (e.g. 403, 405 in FIG. 4E) may be reduced by discarding a selected amount of samples from each end of the ramp to remove errors related to noise or distortion at the extremes of the fine ADC 205 range. Next in step 503, an individual optimal linear fit is computed for each reduced ramp. The linear fitting may be performed using a sub-range of the reduced ramp to avoid biasing the linear fit by the increased non-linearity at the ends of the ramp.

Then in step 505, take the difference between the ramp and the linear fit to compute the individual non-linearity curve as a function of each sample. Denote the fine ADC input as x, the fine ADC output as y, and the fine ADC input to output mapping as $y=f(x)=x+\Delta(x)$ where $\Delta$ is the non-linearity. In order to correct the non-linearity, a function g must be found such that $x \approx g(f(x))$. If g is defined as $g(u)=u-\Delta(u)$, then $g(f(x))=x+\Delta(x)-\Delta(x+\Delta(x))$. The equation $\Delta(x+\Delta(x)) \approx \Delta(x)$ assuming $\Delta$ is smooth and $\Delta(x)$ is small relative to x. These assumptions are true for some types of non-linearity. Based on this logic, associate the computed non-linearity with the corresponding output value at each sample and collect these pairs as step 506.

Next in step 507, repeat steps 501–506 for each ramp in the collected output samples. Then in step 509, average together all of non-linearity values that correspond to each output level to produce an average non-linearity curve as a function of output value. Then in step 511, if the nonlinearity must be compensated for, then generate the average linearity correction curve by subtracting the average non-linearity at each output value from the corresponding output value. Finally in step 513, because every fine ADC output code may not be represented in the collected data, interpolate the average linearity correction curve at the missing output codes.

Method 500 of computing the average linearity correction curve is one of numerous possible techniques. A second method is to align and average the ramps and then compute the non-linearity of the average ramp. This technique is sensitive to changes in the ramp rate, which may not be well controlled. A third method is to average a set of curves where each curve is the estimate of the inverse of the input to output mapping based on fine grain interpolation of the output using the linear model of the input and the available output samples. This technique requires fewer assumptions than the first method but is more sensitive to noise.

In order to accurately characterize the fine ADC 205, enough data must be collected to cover most of its output codes with sufficiently low noise. More data can be gathered by reducing ramp rate of the integrator output 214 to collect more fine ADC samples per ramp. Also, the number of ramps collected can be increased. The ramp rate is generally only adjustable if the external DC input can be finely tuned. The repetitive ramping pattern allows the samples to be collected over an extended period of time. This processing may be adjusted to account for negative integrator drift. If the PWM 217 uses a non-return-to-zero scheme, the processing above must split each ramp into alternating fields that are processed independently to avoid an error related to alternating injected current.

Figure 6:
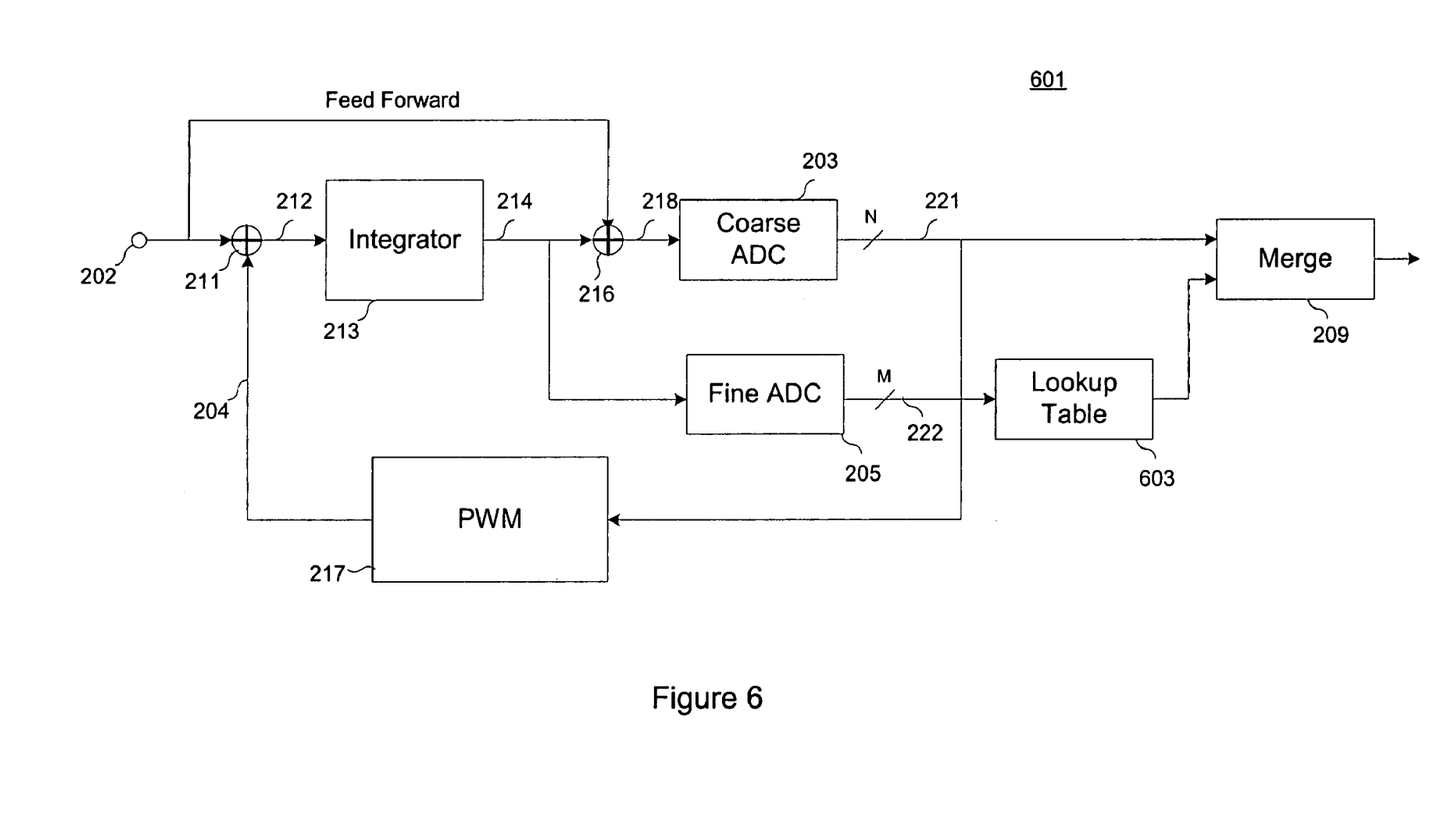
FIG. 6 shows a delta-sigma ADC having an internal ADC with corrected non-linearity.

After non-linearity has been detected in an internal ADC, it may be impossible or impractical to fix the root problem in some designs. Under such circumstances, the nonlinearity can be corrected by adding a lookup table that produces the correct, linear value that the internal ADC should have generated. FIG. 6 shows one embodiment of a circuit 601 for correcting non-linearity in an internal ADC. Circuit 601 is similar to the delta-sigma ADC 201 of FIG. 2, with the addition of a lookup table 603 inserted between the fine ADC 205 and the merge mechanism 209. The output 222 of the fine ADC 205 (the incorrect, non-linear value) becomes the index value to the lookup table 603. The lookup table 603 provides a corrected value that is substituted for each fine ADC output value 222 to correct for the fine ADC's non-linearity, before being recombined with the coarse ADC output by the merge mechanism 209. The rest of the circuit functions as previously described. The entries to the lookup table are just values in the averaged linearity correction curve from method 500. During regular operation of the delta-sigma ADC 501, each fine ADC output value 222 is substituted with the proper corrected value from the lookup table 603, before merging with the coarse ADC output 221. The same method may be used to correct non-linearities in the coarse ADC output 221, using a lookup table inserted after the coarse ADC 203, before the PWM input and the merge mechanism 209. The output of internal ADC 107 can also be similarly corrected for.

Although the present invention has been described in detail with reference to particular embodiments, persons possessing ordinary skill in the art to which this invention pertains will appreciate that various modifications and enhancements may be made without departing from the spirit and scope of the claims that follow.

I claim:

1. A method for testing a circuit that converts an applied analog input signal to a digital representation thereof, comprising:
   (a) applying a constant DC value as the input signal;
   (b) forming a sum of the constant DC value and a feedback signal;
   (c) integrating the sum found in (b);
   (d) generating a first digital approximation including the integrated sum found in (c); and
   (e) generating the feedback signal, wherein the feedback signal allows ramping of the integrated sum and a reset of the ramping.

2. A method as in claim 1, wherein the constant DC value is selected to adjust the rate of the ramping in (e).

3. A method as in claim 1, wherein generating the feedback signal in (e) includes:
   setting the feedback signal to a first value when the first digital approximation is below a threshold level; and
   setting the feedback signal to a second value when the first digital approximation is above the threshold level.

4. A method as in claim 1, further comprising:
   (f) characterizing the first digital approximation.

5. A method as in claim 4, wherein characterizing the first digital approximation includes determining the linearity of the first digital approximation.

6. A method as in claim 5, wherein determining the linearity of the first digital approximation includes:
   (g) determining a linear fit for each ramp in the first digital approximation;
   (h) calculating the difference between each ramp and its corresponding linear fit to produce a non-linearity curve; and
   (i) averaging the non-linearity curves found in (h) to produce a first average non-linearity curve for the first digital approximation.

7. A method as in claim 6, further comprising:
   calculating first corrected values for the first digital approximation;
   storing the first corrected values in memory; and
   substituting the first corrected values for the first digital approximation.

8. A method as in claim 7, wherein the first corrected values are generated by subtracting the average non-linearity curve from the first digital approximation.

9. A method as in claim 1, further comprising:
   generating a second digital approximation including the integrated sum found in (c); and
   characterizing the second digital approximation.

10. A method as in claim 9, wherein characterizing the second digital approximation includes determining the linearity of the second digital approximation.

11. A method as in claim 10, wherein characterizing the second digital approximation includes:
   (j) determining a linear fit for each ramp in the second digital approximation;
   (k) calculating the difference between each ramp and its corresponding linear fit to produce a non-linearity curve; and
   (l) averaging the non-linearity curves found in (k) to produce a second average non-linearity curve.

12. A method as in claim 11, further comprising:
   calculating second corrected values for the second digital approximation;
   storing the second corrected values in memory; and
   substituting the second corrected values for the second digital approximation.

13. A method as in claim 1, wherein applying a constant DC input value includes zeroing the input.

14. A method for testing a circuit that converts an applied analog input signal to a digital representation thereof, comprising:
   (a) applying a constant DC value as the input signal;
   (b) forming a sum of the constant DC value and a feedback signal;
   (c) integrating the sum found in (b);
   (d) generating a first digital approximation including the integrated sum found in (c);
   (e) generating the feedback signal wherein the feedback signal allows ramping of the integrated sum;
   (f) setting the feedback signal to a fixed value; and
   (g) changing the constant DC value to reset the ramping of the integrated sum.

15. A method for characterizing an internal ADC within a delta-sigma ADC that converts an applied analog input signal to a digital representation thereof, comprising:
   integrating the sum of a constant DC input and a variable value to create a ramp;
   applying the ramp to a first internal ADC having a first input range;
   generating a first digital approximation of the ramp; and
   switching the variable value to reset the ramp to one end of the first input range.

16. A method as in claim 15, wherein the variable value switches between two possible values.

17. A method as in claim 15, further comprising:
   determining the error due to quantization of the first digital approximation;
   applying the error to a second internal ADC; and
   generating a second digital approximation of the error.

18. A method as in claim 17, wherein the linearity of at least one of the first and second digital approximations is determined.

* * * * *